(12) United States Patent
Tsukamoto et al.

(10) Patent No.: US 7,290,911 B2
(45) Date of Patent: Nov. 6, 2007

(54) VEHICULAR LAMP

(75) Inventors: Hironori Tsukamoto, Shizuoka (JP);
Kaoru Yamamoto, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 114 days.

(21) Appl. No.: 11/112,169

(22) Filed: Apr. 22, 2005

(65) Prior Publication Data
US 2005/0237760 A1    Oct. 27, 2005

(30) Foreign Application Priority Data
Apr. 22, 2004    (JP) .......................... P.2004-126756

(51) Int. Cl.
*F21S 8/10* (2006.01)
(52) U.S. Cl. .................. 362/543; 362/249; 362/473; 362/507
(58) Field of Classification Search ................ 362/543, 362/249, 544, 545, 473, 475, 507, 800, 16; 361/313, 315, 749
See application file for complete search history.

(56) References Cited

U.S. PATENT DOCUMENTS

| 5,490,049 A | * | 2/1996 | Montalan et al. ............ 362/240 |
| 2002/0003700 A1 | * | 1/2002 | Selkee ........................ 362/249 |

FOREIGN PATENT DOCUMENTS

JP    2000-260206    9/2000

* cited by examiner

*Primary Examiner*—Sandra O'Shea
*Assistant Examiner*—Mark Tsidulko
(74) *Attorney, Agent, or Firm*—Koda & Androlia

(57) ABSTRACT

A vehicular lamp including a luminescent element module made of a flexible parallel wiring body, which is made of a plurality of flexible wiring conductors that are disposed parallel to each other and sheathed by soft plastic, and a plurality of light-emitting diodes, which are mounted on the flexible parallel wiring body, so that the luminescent element module has a conductive path formed by notching a part of the wiring conductors of the flexible parallel wiring body and/or by connecting a plurality of the wiring conductors together, and the luminescent element module is provided on the lamp body so that the light-emitting diode faces in the direction of radiation of the vehicular lamp.

8 Claims, 10 Drawing Sheets

VEHICULAR LAMP

BACKGROUND OF THE INVENTION

1. Technical Field

The present invention relates to a vehicular lamp and more particularly to a vehicular lamp that is manufactured at low cost.

2. Description of the Related Art

Some of the recent vehicular lamps are equipped with circuitries.

For installing a circuitry in a vehicular lamp, the circuitry is formed on a hard substrate or an FPC (Flexible Printed Circuit), and this substrate or an FPC that has the circuitry mounted is installed in a vehicular lamp.

However, building a circuitry on a hard substrate inevitably tends to restrict the shape of the vehicular lamp to which the circuitry is applied. In other words, a hard substrate only allows flat placement of electronic components, which is a problem. Thus, when a light-emitting diode, for example, is used as a light source in place of an incandescent bulb, the light-emitting bulb can only be disposed flatly; and as a result, in vehicular lamps that use hard substrates, the light-emitting diodes are installed only flatly.

On the contrary, an FPC has flexibility and thus can be bent or curved at any desired positions, thus allowing a three-dimensional arrangement of light-emitting diodes. However, the FPC becomes exclusive to each vehicular lamp type, and the manufacture of which requires many complicated processes; as a result, since vehicular lamps generally come in a wide variety of types and thus involve limitations in the number of production, vehicle lamps that use the FPC have problems in view of the manufacturing costs. Moreover, since the FPC wiring conductor uses extremely thin copper foil or the like, there is almost no expectation for a heat dissipation effect via the wiring conductor.

Japanese Patent Application Laid-Open (Kokai) No. 2000-260206 proposes a vehicular lamp in which the luminescent element module with light-emitting diodes mounted on parallel bus bars is disposed on the back surface of the lamp body.

Using the bus bar as a base for mounting the light-emitting diode considerably reduces the manufacturing costs compared with the use of FPC.

In the vehicular lamp of the Japanese Patent Application Laid-Open (Kokai) No. 2000-260206, the position of the light-emitting diode is determined in accordance with the lamp body shape by way of mounting the light-emitting diodes on parallel bus bars and then bending the bus bars. Accordingly, there is a freedom in the lamp body shape design, and a heat dissipation effect via the bus bars can be expected.

However, the bus bar is formed from a thick metal plate that has high rigidity, which makes it difficult to position the bus bar along the back surface of the lamp body which also has high rigidity and a complicated three-dimensional shape. This consequently limits the shape of the lamp body to which the bus bar is applied.

Furthermore, each bus bar is an independent element, and therefore, a plurality of bus bars must be individually installed in the lamp body. This in turn makes the work for installing the luminescent element module and circuit module on the body more complicated. More labor is required for larger lamp bodies, and an increase in the manufacturing cost is unavoidable.

It is also difficult to configure complicated circuitries.

BRIEF SUMMARY OF THE INVENTION

Accordingly, the object of the present invention is to provide a vehicular lamp that involves a luminescent element module or a circuit module which can be easily installed on the back of a vehicle lamp body and is capable of having complicated circuit configurations.

The above object is accomplished by a unique structure of the present invention for a vehicular lamp that is provided with a luminescent element module which has a plurality of light-emitting diodes and is disposed on the back surface of the lamp body; and in the present invention, the luminescent element module is comprised of a flexible parallel wiring body, which is made of a plurality of flexible wiring conductors that are disposed parallel to each other and sheathed by soft plastic, and a plurality of light-emitting diodes, which are mounted on the flexible parallel wiring body, and this luminescent element module is provided with a conductive path formed by notching a part of the wiring conductors of the flexible parallel wiring body and/or by connecting a plurality of the wiring conductors together; and in addition, the luminescent element module is provided on the lamp body so that the light-emitting diode faces in a direction of radiation of the vehicular lamp.

In the above-described vehicular lamp of the present invention, the light-emitting diode is mounted on a flexible parallel wiring body. Accordingly, it is possible to arrange a plurality of light-emitting diodes in a three-dimensional fashion by bending the flexible parallel wiring body at desired locations. Moreover, it is also possible to form a desired conductive path by notching a part of the wiring conductor and/or by connecting a plurality of wiring conductors together. Accordingly, a complicated circuit configuration can be easily achieved at low cost.

The above object is further accomplished by another unique structure of the present invention for a vehicular lamp that has a circuit module provided on the back of the lamp body; and in the present invention, the circuit module is comprised of a flexible parallel wiring body, which is made of a plurality of flexible wiring conductors that are disposed parallel to each other and sheathed by soft plastic, and a plurality of electronic components, which are mounted on the flexible parallel wiring body; and this circuit module is provided with a conductive path formed by notching a part of the wiring conductors of the flexible parallel wiring body and/or by connecting a plurality of the wiring conductors together.

In this structure of the present invention, the circuit module has a plurality of electronic components mounted on a flexible parallel wiring body. Therefore, the circuit module can be arranged three-dimensionally. In other words, there is an increased degree of freedom regarding the arrangement structure of the circuit module, which contributes to making the vehicular lamp more compact. Moreover, it is possible to form a desired conductive path by way of notching a part of the wiring conductor and/or connecting a plurality of wiring conductors together; therefore, a circuit configuration more complicated than that which uses a bus bar can be achieved, and the lamps can be less expensive than those that use the FPC.

As described above, in the vehicular lamp of the present invention that includes the luminescent element module, a plurality of light-emitting diodes are mounted on a flexible parallel wiring body in which a plurality of flxible wiring conductors are arranged parallel and covered by a soft plastic material. Accordingly, it is possible to arrange a plurality of light-emitting diodes in a three-dimensional manner by bending the flexible parallel wiring body at appropriate locations. As a result, there are no restrictions on the shape of the lamp body on which the luminescent element module is provided, and the present invention is thus applicable to vehicular lamps of various shapes.

Moreover, in the present invention, it is possible to form a desired conductive path by notching a part of the wiring conductor and/or connecting a plurality of wiring conductors together. Accordingly, desired circuit configurations can be easily achieved, and thus a vehicular lamp equipped with various lighting modes can be obtained at low cost.

Furthermore, in the present invention, the flexible parallel wiring body can include three or more wiring conductors, which in turn allows a complicated circuit layout. For example, it is possible to form a vehicular lamp that is equipped with various lighting modes, which may light each of a plurality of light-emitting diodes to a different brightness or the like. Furthermore, unlike the case in which two wiring conductors are used, in the three or more wiring conductor structure, a position for supplying power can be aggregated at one end portion of the module, so that a connecting structure of the flexible parallel wiring body with a power supply portion can be simplified.

Furthermore, in the vehicular lamp of the present invention that includes the luminescent element module, positioning means are provided on the back surface of the lamp body, and these positioning means engage with either the light-emitting diode on the luminescent element module or a lamp cover in which the luminescent element module having the light emitting diodes is installed, so that the positioning of the light-emitting diodes with respect to the lamp body is made. Therefore, the displacement of the light-emitting diode is suppressed, light flux from the light-emitting diode can be effectively utilized, and the minimum number of required light-emitting diodes can be suppressed. Furthermore, it is possible to simultaneously achieve the positioning of the light-emitting diode for obtaining a desired light distribution and the installation of the luminescent element module on the lamp body, thus suppressing the manufacturing costs.

In addition, in the vehicular lamp of the present invention that includes the circuit module, the circuit module includes a plurality of electronic components mounted on the flexible parallel wiring body. Therefore, the circuit module can be provided three-dimensionally. In other words, there is an increased degree of freedom regarding the circuit module, which makes the vehicular lamp more compact. Moreover, a desired conductive path is formed by notching a part of the wiring conductor and/or connecting a plurality of wiring conductors together; therefore, a circuit configuration more complicated than that which uses a bus bar can be achieved, which is less expensive than the structure that uses the FPC.

Furthermore, in the vehicular lamp of the present invention that includes the circuit module, three or more wiring conductors can be employed, which in turn allows a complicated circuit layout. In addition, unlike the case in which two wiring conductors are used, in the three or more wiring conductor structure, a position for supplying power can be aggregated at one end portion of the module, so that a connecting structure of the flexible parallel wiring body with a power supply portion can be simplified.

DETAILED DESCRIPTION OF THE INVENTION

Hereinafter, the preferred embodiments of the vehicular lamp according to the present invention will be described with reference to the accompanying drawings.

Figure 1:
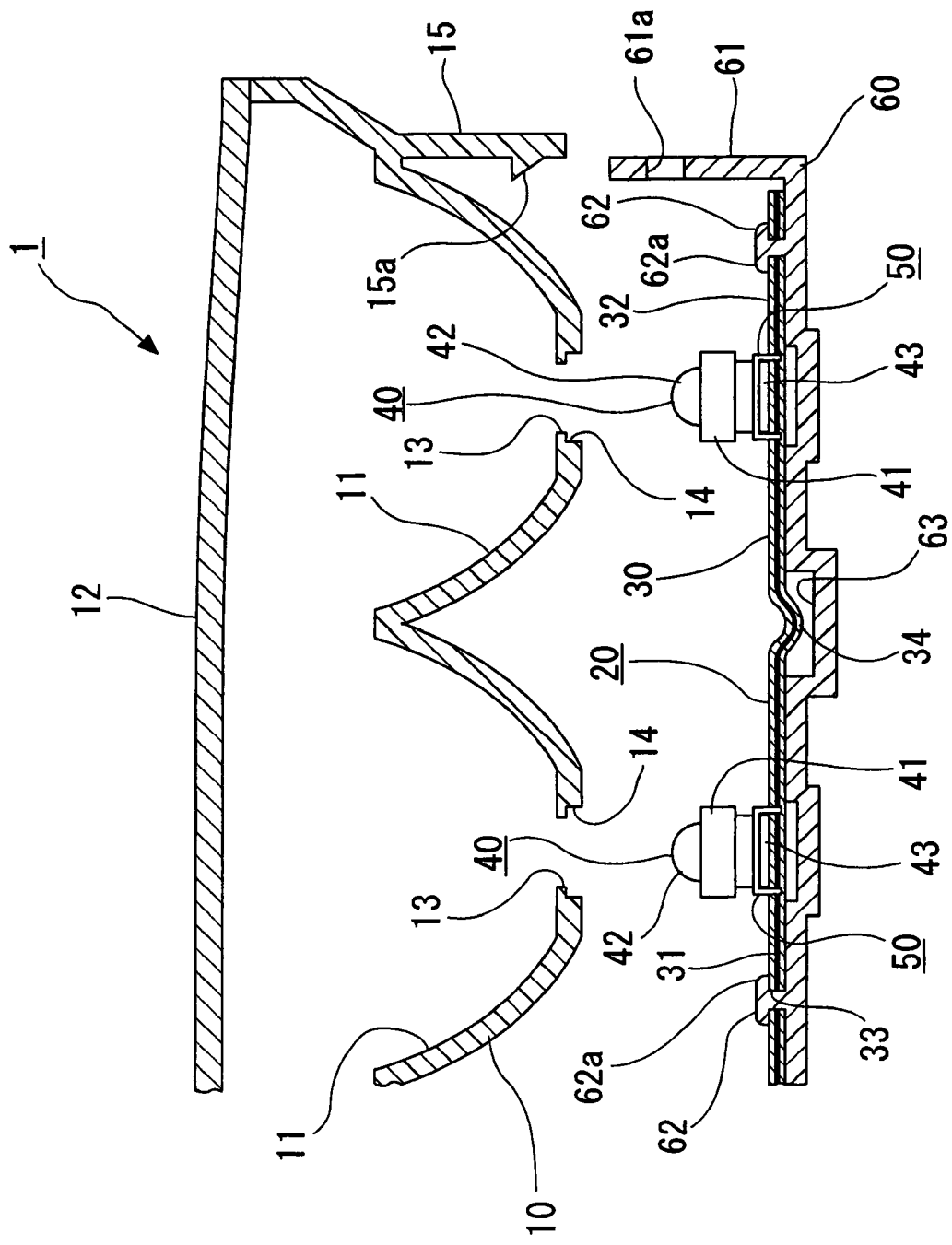
FIG. 1 shows the first embodiment of the vehicular lamp according to the present invention, being a vertical cross-sectional view of a main portion.

FIG. 1 shows the first embodiment of the vehicular lamp of the present invention.

A vehicular lamp 1 is comprised of a lamp body 10 and a luminescent element module 20 which is provided on the back surface of the lamp body 10.

On the lamp body 10, a plurality of concave portions 11 (only two of which are shown in FIG. 1) are formed such that the luminescent elements (diodes) of the luminescent element module 20 face forward (upward in FIG. 1). Each of the front surfaces of the concave portions 11 is covered by a cover lens 12. The concave portions 11 open forward, and positioning openings 13 are formed on the rear or bottom end portions. Shallow concave engagement edges 14 are formed on a portion of on the concave portions 11 that surround the rear surfaces of the positioning openings 13. In addition, rear-projecting engaging segments 15 (only one of which is shown in FIG. 1) are formed on the end portions of the lamp body 10 so as to project rearward, and engaging tabs 15a are formed on the engaging segments 15.

The luminescent element module 20 is formed with a plurality of light-emitting diodes 40 mounted as luminescent elements on a flexible parallel wiring body 30. As seen from FIGS. 2(a) and 3(b), the flexible parallel wiring body 30 is a so-called FFC (Flexible Flat Cable) in which a plurality of wiring conductors 31 having flexibility are arranged in parallel and covered by a sheath 32 using a soft plastic such as PET (polyethylene terephthalate) or the like. This structure is obtained by, for example, arranging copper-made wiring conductors 31*at* fixed intervals and sandwiching the top and bottom of them with a plastic tape and further by applying heat and pressure thereon to heat-seal the tape adhesive surface or to adhere an adhesives to the tape adhesive surface.

Figure 2A:
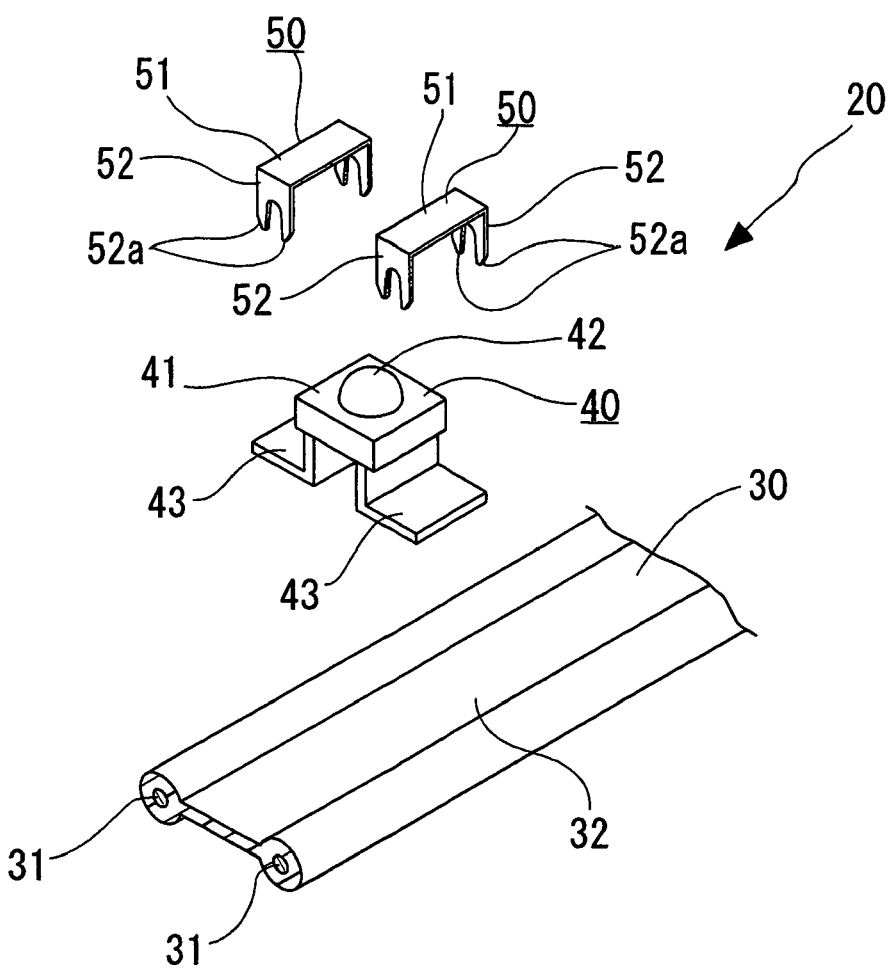
FIG. 2(a) shows the manner of mounting the light-emitting diode according to the present invention.
Figure 2B:
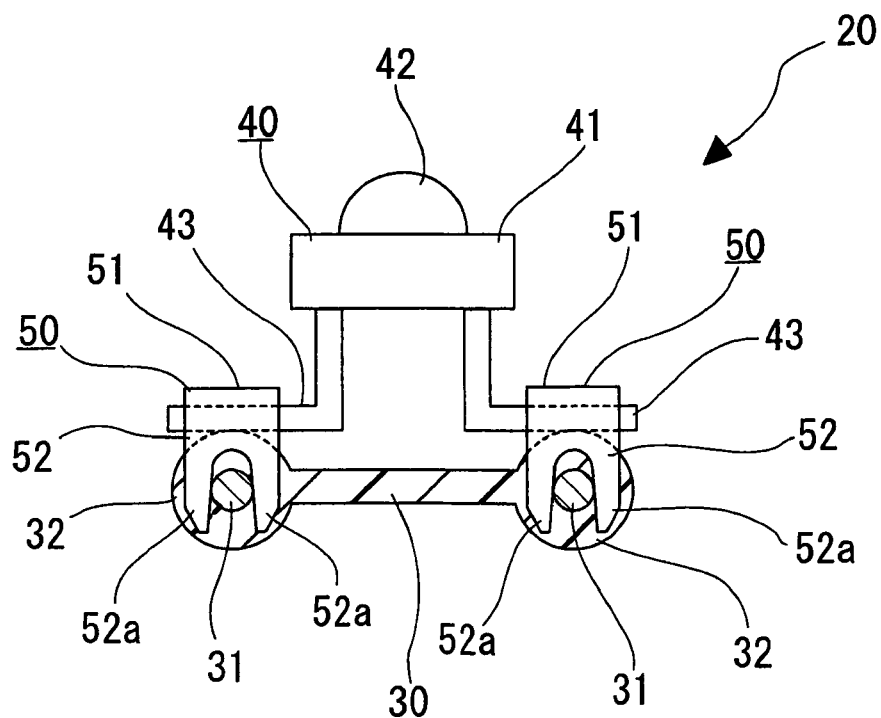
FIG. 2(b) is a cross-sectional view of the mounted light-emitting diode.
Figure 3A:
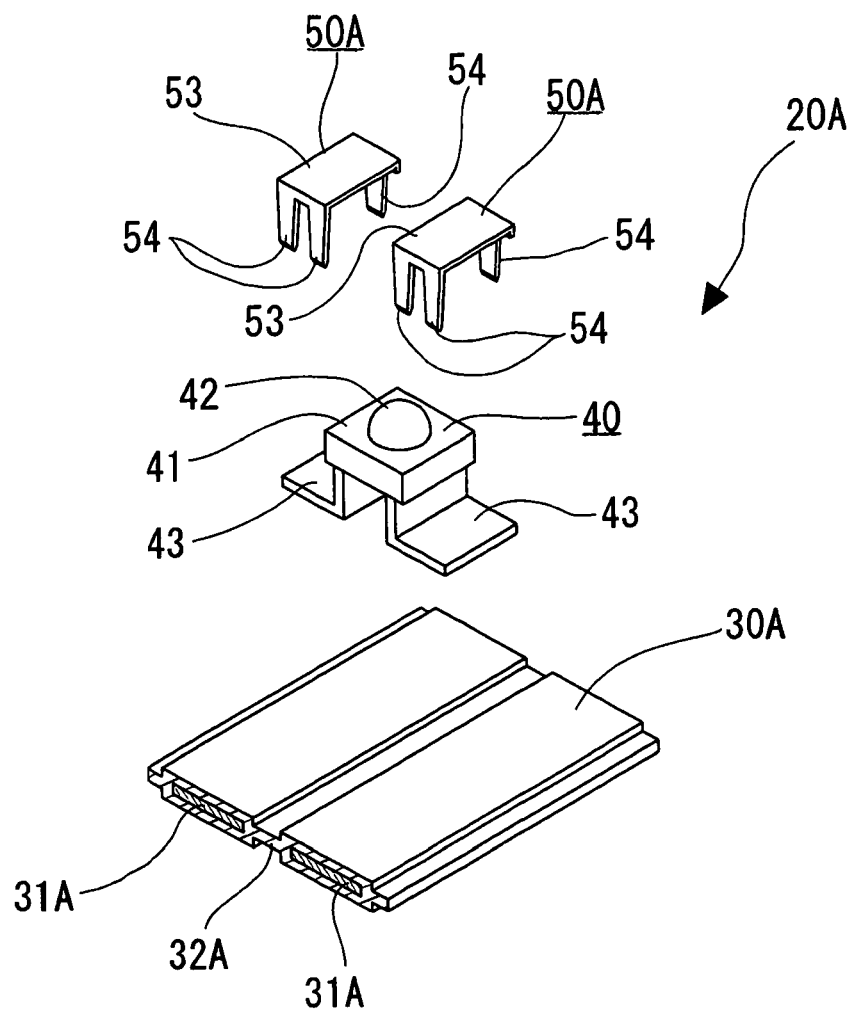
FIG. 3(a) shows another manner of mounting the light-emitting diode according to the present invention.
Figure 3B:
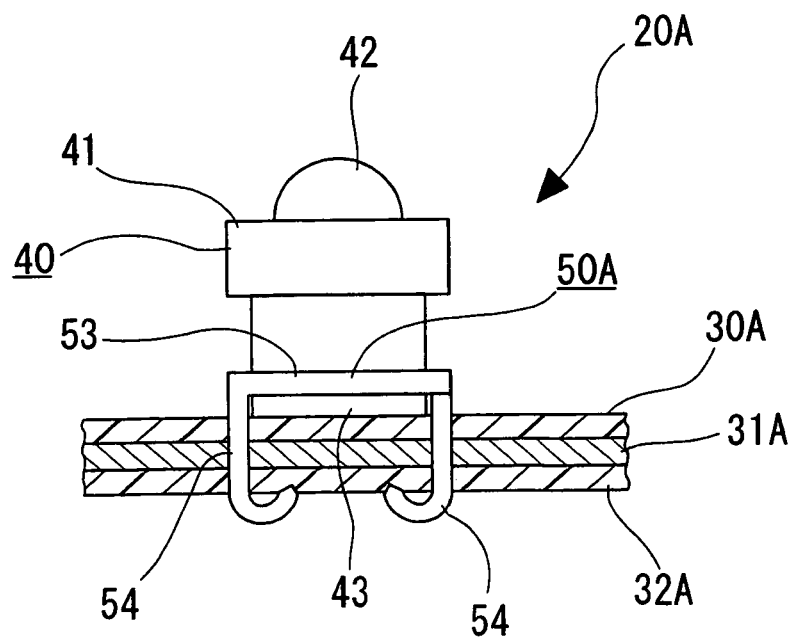
FIG. 3(b) is a cross-sectional view thereof of the mounted light-emitting diode.

The wiring conductor 31 is in a shape of a round wire having a circular cross-section (hatched lines) as shown in FIGS. 2(a) and 2(b), and it can be in a shape of a flat plate line (FFC) as shown in FIGS. 3(a) and 3(b). The quantity of the wiring conductors 31 is not limited to two, and three or more wiring conductors 31 can be used as described later.

The light-emitting diode 40 used in the present invention is in such a configuration that a transparent lens portion 42, which allows the light-emitting section inside of a package 41 to face forward, projects in a dome shape from the central front end of the rectangular package 41, and two lead segments 43 project in the mutually opposing directions from the rear end.

The above-described light-emitting diode 40 is mounted on the flexible parallel wiring body 30 by pressing terminals 50.

The pressing terminal 50 shown in FIGS. 2(a) and 2(b) is formed by machining a conductive metal plate, so that two leg segments 52 that project in the same direction are formed on both ends of a pressing portion 51. Mounting of the light-emitting diode 40 using the two pressing terminals 50 is achieved as follows.

First, the lead segments 43 of the light-emitting diode 40 are set to be separately positioned on top of two adjacent wiring conductors 31 (via a coating 32). In this state, the leg segments 52 of the pressing terminals 50 are positioned so as to respectively straddle the lead segments 43 of the light-emitting diode 40, and the ends of the toes 52a of the leg segments 52 of the pressing terminals 50 are positioned respectively to straddle the wiring conductors 31 (see FIG. 2(a)). The pressing terminals 50 are then pressed in this state against the flexible parallel wiring body 30. By this pressing, the leg segments 52 of the pressing terminals 50 penetrate the surface of the coating 32 to press against the inside of the coating 32, and the toes 52a are positioned to sandwich the wiring conductors 31 inside the coating 32 from both sides and contact the wiring conductors 31 (see FIG. 2(b)); and in addition, the pressing portions 51 of the pressing terminal 50 each become separately pressed against top surfaces of the lead segments 43 of the light-emitting diode 40. Accordingly, the lead segments 43 of the light-emitting diode 40 are joined to the wiring conductors 31 of the flexible parallel wiring body 30 by the pressing terminals 50. The light-emitting diode 40 is thus mounted on the flexible parallel wiring body 30.

Mounting of the light-emitting diode 40 to the flexible parallel wiring body 30 can be achieved also by connecting terminals 50A as shown in FIGS. 3(a) and 3(b). In the flexible parallel wiring body 30A shown in FIGS. 3(a) and 3(b), a flat plate line is used for wiring conductors 31A.

The connecting terminal 50A is formed by machining a conductive metal plate, so that one tab segment 54 projects from the center of one side edge a joining portion 53, and two tab segments 54 project in the same direction from the edge on the other side. Each tab segment 54 has a tapered shape. Mounting of the light-emitting diode 40 using the connecting terminals 50A is achieved as follows.

First, the lead segments 43 of the light-emitting diode 40 are set to be separately positioned on top of two adjacent wiring conductors 31A (via a coating 32A). In this state, the tab segments 54 of the connecting terminals 50A are positioned so as to respectively straddle the lead segments 43 of the light-emitting diode 40 (see FIG. 3(a)). Then, the connecting terminals 50A are pressed against the flexible parallel wiring body 30A. By this pressing, the tab segments 54 of the connecting terminals 50A penetrate the coating 32A and the wiring conductors 31A to emerge on the back side of the coating 32A, and furthermore, the end portions of the tab segments 54 are folded so as to wrap around the back surface of the coating 32A (see FIG. 3(b)). In addition, the joining portions 53 separately come into contact with the top surfaces of the lead segments 43 of the light-emitting diode 40. Accordingly, the lead segments 43 of the light-emitting diode 40 are joined to the wiring conductors 31A of the flexible parallel wiring body 30A by the connecting terminals 50A. The light-emitting diode 40 is thus mounted to the flexible parallel wiring body 30A to form a luminescent element module 20A.

The method for mounting the light-emitting diode 40 on the flexible parallel wiring bodies 30 and 30A is not limited to those described above. Mounting can be accomplished by various other methods. In one example, the coatings 32 and 32A serving as mounting positions of the light-emitting diode 40 are removed to expose the wiring conductors 31 and 31A, and then the lead segments 43 of the light-emitting diode 40 are soldered to the exposed parts of the wiring conductors 31.

Figure 4A:
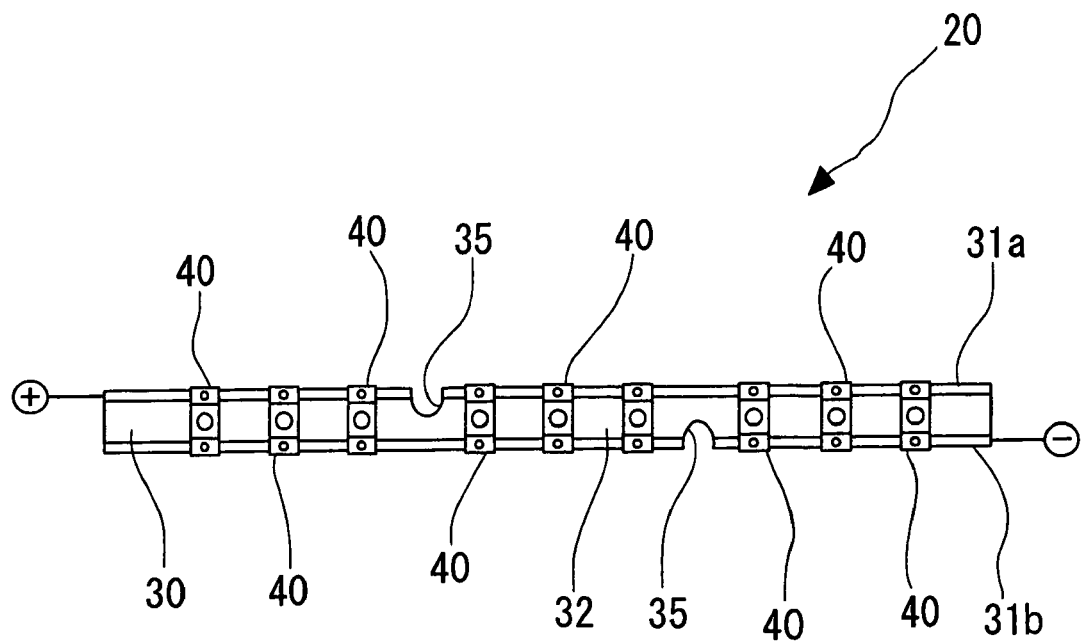
FIG. 4(a) shows an example of the luminescent element module.
Figure 4B:
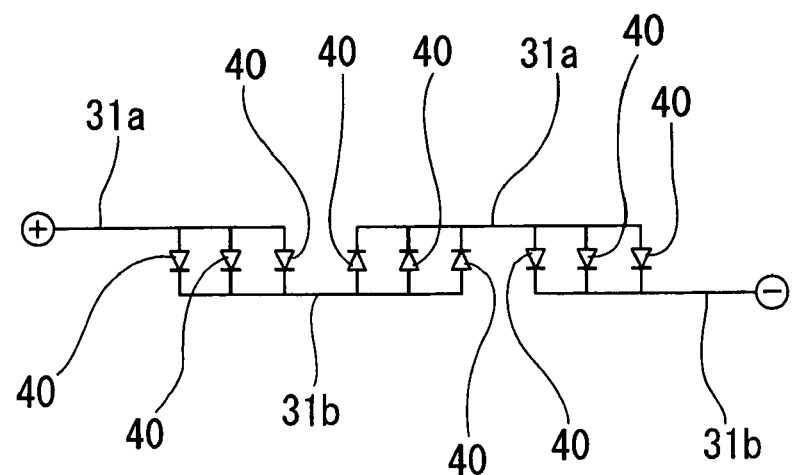
FIG. 4(b) is a circuit diagram thereof.

In the above luminescent element modules 20 and 20A, a desired conductive path is formed by notching a part of the wiring conductors 31A of the flexible parallel wiring bodies 30 and 30A and/or joining a plurality of wiring conductors 31A together. As shown in FIG. 4(a), for example, notches 35 are formed by cutting a part of each of the wiring conductors 31a and 31b at predetermined positions, and the end of the wiring conductor 31a is connected to a power supply voltage (+), while the end of the wiring conductor 31b is grounded (−). As a result, a circuit as shown in FIG. 4(b) is formed in which three parallel circuits of the light-emitting diode 40 are connected in series.

The luminescent element module 20, which is formed by mounting the light-emitting diodes 40 on the flexible parallel wiring body 30, is installed in a back cover 60 and provided on the lamp body 10.

More specifically, as seen from FIG. 1, the back cover 60 is made of synthetic resin molding and has a shape that substantially covers the positioning openings 13 of the lamp body 10. The back cover 60 further has engaging segments 61 (only one of which is shown in the figure) that project forward at both end portions, and these engaging segments 61 are formed with engaging holes 61a. Furthermore, a plurality of supporting pins 62 and recesses 63 are formed on the front surface (or the bottom) of the back cover 60.

On the flexible parallel wiring body 30 of the luminescent element module 20 that is installed in the back cover 60, supporting holes 33 are formed at appropriate intervals in the length direction. The luminescent element module 20 is set on the front surface (or the bottom) of the back cover 60, and the support pins 62 of the back cover 60 are inserted through the supporting holes 33. In addition, the ends of the support pins 62 are heat caulked to form the bulged ends 62a that prevent separation of the luminescent element module 20 from the back cover 60. As long as the luminescent element module 20 is prevented from being separated from the back cover 60, the support holes 33 can be formed slightly larger than necessary with respect to the support pins 62 so that the luminescent element module 20 is somewhat loose with respect to the back cover 60. Moreover, some portions 34 between the adjacent supporting holes 33 and 33 are located inside the recess 63 of the back cover 60.

The back cover 60 that contains, as described above, the luminescent element module 20 is brought to the back surface of the lamp body 10, and the engaging holes 61a of the engaging segments 61 of the back cover 60 are fitted in the engaging tabs 15a of the engaging segments 15 of the lamp body 10. The back cover 60 is thus set on the back of the lamp body 10. At this time, the front end portions of the packages 41 of the light-emitting diodes 40 on the luminescent element module 20, which is installed in the back cover 60, are fitted to and positioned by the engagement edges 14 formed in the back surface of the lamp body 10, so that the transparent lens portions 42 of the light-emitting diodes 40 are positioned inside the positioning openings 13 to face forward. As a result, the packages 41 of the light-emitting diodes 40 are securely pressed against the engagement edges 14 of the lamp body 10 and positioned precisely.

Figure 5A:
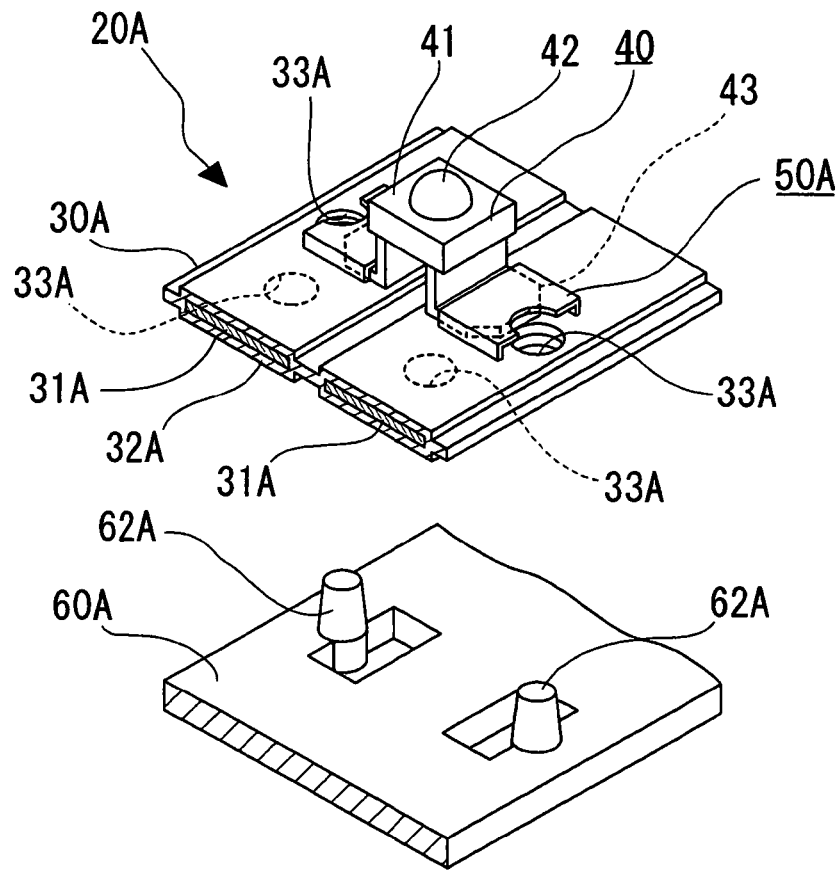
FIG. 5(a) shows an example of positioning the luminescent element module on the back cover according to the present invention.
Figure 5B:
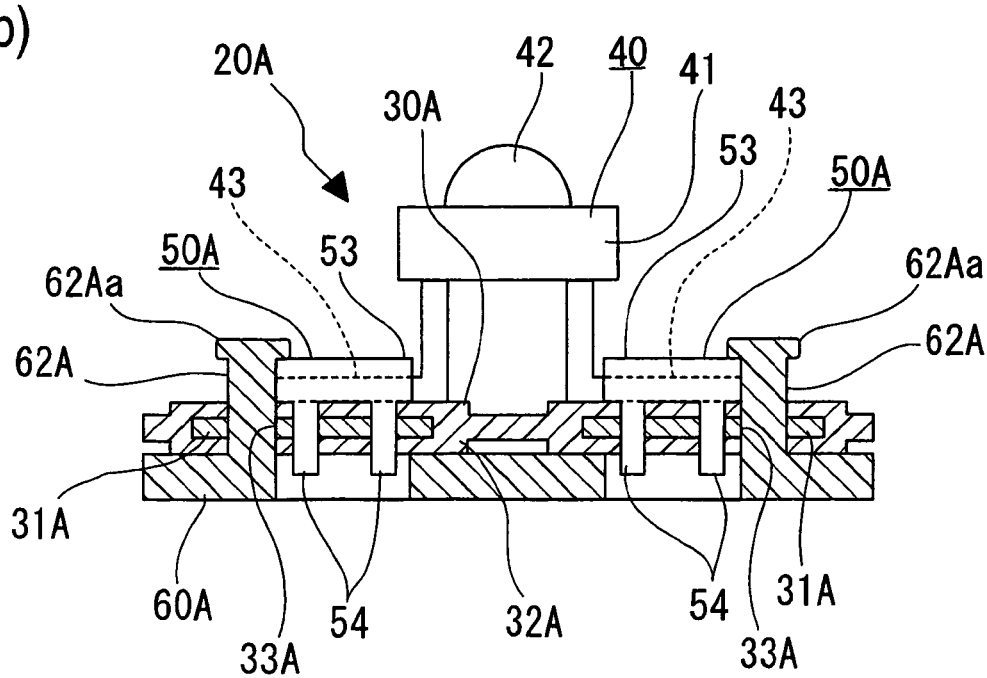
FIG. 5(b) is a cross-sectional view of the main portion thereof.

FIGS. 5(a) and 5(b) show another configuration to install the luminescent element module 20A in the back cover.

In this structure, supporting holes 33A are formed in the luminescent element module 20A in the vicinity of the locations where the light-emitting diodes 40 are provided, and support pins 62A are formed in the back cover 60A so as to protrude.

The support pins 62A of the back cover 60A are inserted through the supporting holes 33A formed in the luminescent element module 20A. The tip ends of the support pins 62A are heat caulked to form the bulged ends 62Aa so as to prevent the separation of the luminescent element module 20A from the back cover 60A. In this structure, the light-emitting diodes 40 are installed in the back cover 60A so that they are positioned inside the positioning openings 13 and face forward; accordingly, the lamp body 10 does not need to have the engagement edges 14 which is formed in the structure shown in FIG. 1. Moreover, the supporting holes 33A of the luminescent element module 20A can be formed at positions shown by broken lines in FIG. 5(a).

Figure 6:
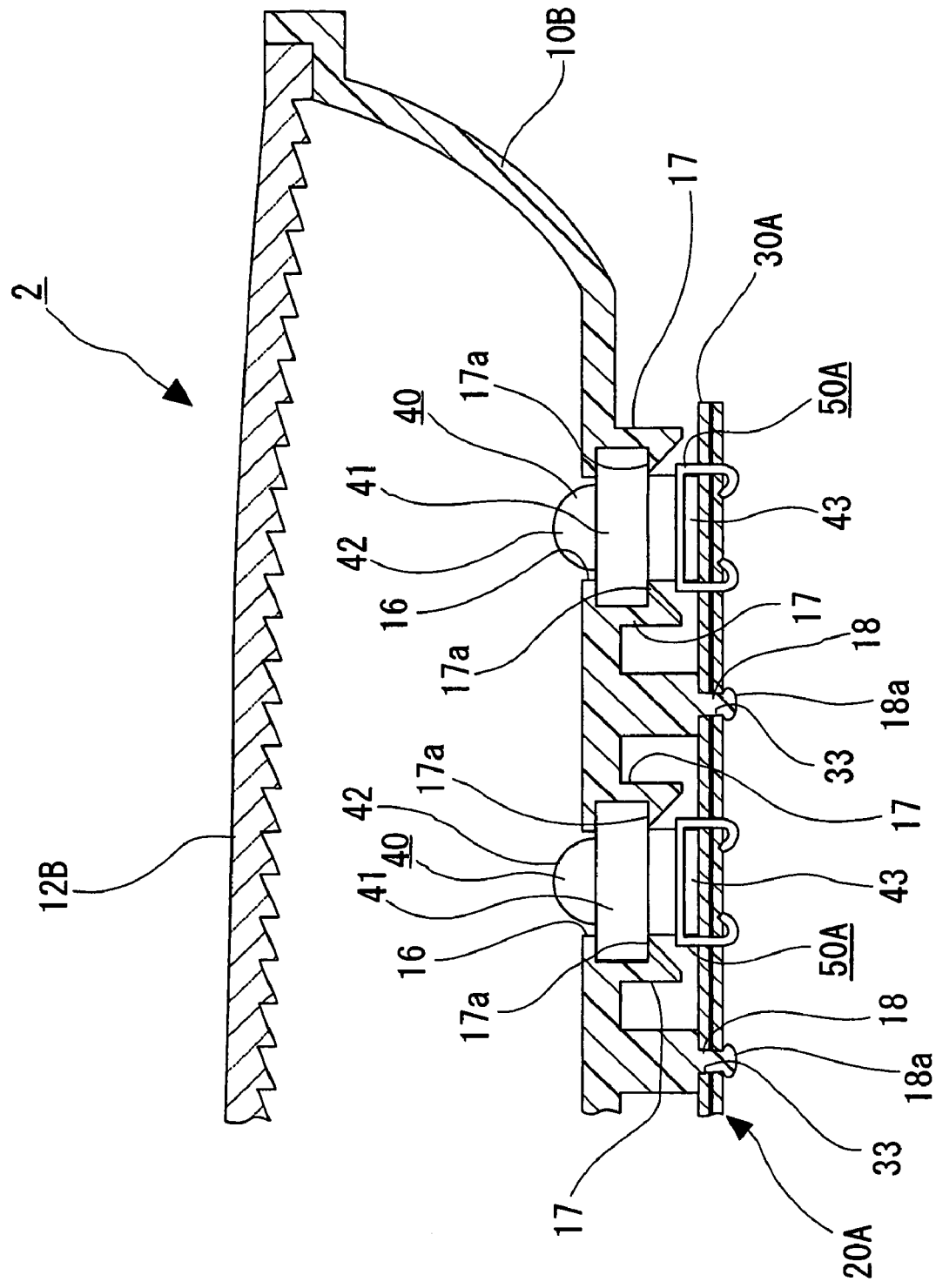
FIG. 6 is a cross-sectional view of the main portion of the second embodiment of the vehicular lamp according to the present invention.

FIG. 6 shows the second embodiment of the vehicular lamp of the present invention. In this vehicular lamp 2 of the second embodiment, the luminescent element module is provided on the lamp body without the use of a back cover.

More specifically, the lamp body 10B of the vehicular lamp 2 has opening in the front, and the front opening is covered by a cover lens 12B. A plurality of positioning openings 16 are formed in the rear surface portion of the lamp body 10B. Engaging segments 17 (only one is shown) project from the position sandwiching the positioning openings 16 in the rear surface of the lamp body 10B, and engaging tabs 17a are formed on the opposing surfaces of the engaging segments 17. Furthermore, a plurality of support pins 18 project from the rear surface of the lamp body 10B.

The packages 41 of the light-emitting diodes 40 of the luminescent element module 20A (see FIGS. (a) and (b)) are received between the engaging segments 17 and 17 of the lamp body 100B. In addition, the transparent lens portions 42 of the packages 41 are positioned inside the positioning openings 16 and face forward, whereas the front surfaces of the packages 41 are in contact with the rear surface of the lamp body 10B. By this arrangement, the engaging tabs 17a of the engaging segments 17 fit to the rear surfaces of the packages 41, thus positioning and holding the light-emitting diodes 40 on the lamp body 10B. The support pins 18 of the lamp body 10B are inserted through the supporting holes 33 of the flexible parallel wiring body 30A, and the end portions of the support pins 18 are heat caulked to form the bulged ends 18a so that the separation of the luminescent element module 20A from the lamp body 10B is prevented.

Figure 7A:
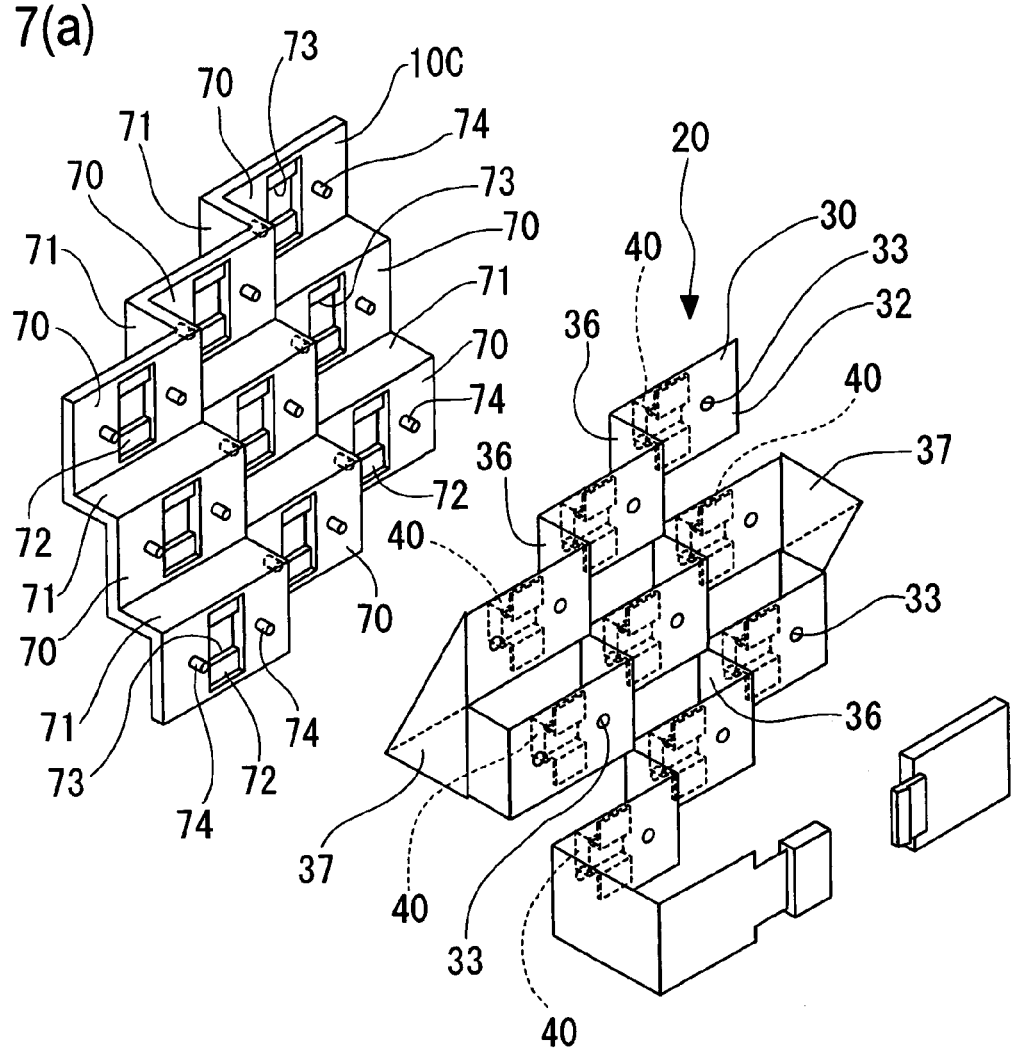
FIG. 7(a) shows the main portion of the third embodiment of the vehicular lamp according to the present invention.
Figure 7B:
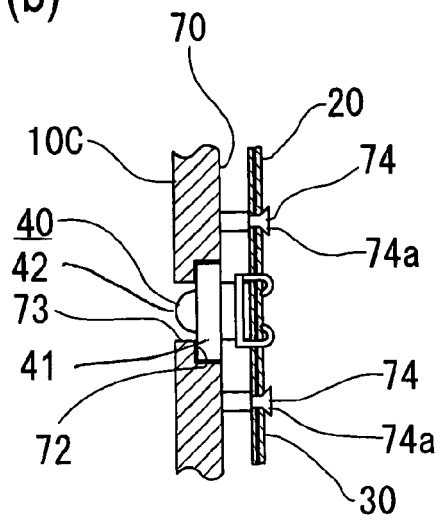
FIG. 7(b) is a cross-sectional view of the main portion showing a configuration for positioning the light-emitting diode.
Figure 7C:
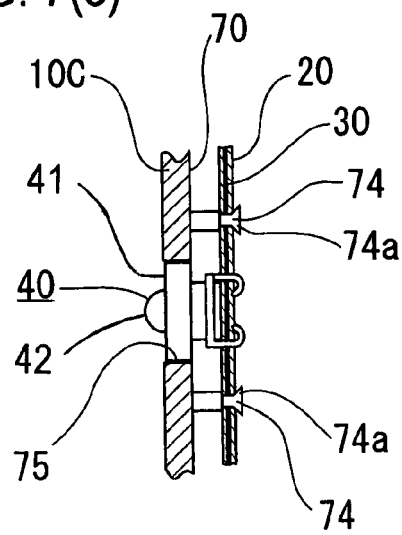
FIG. 7(c) is a cross-sectional view of the main portion showing another configuration for positioning the light-emitting diode.

FIGS. 7(a) through 7(c) show the third embodiment of the vehicular lamp according to the present invention. In this embodiment, the light-emitting diodes 40 are provided in a three-dimensional fashion.

More specifically, the rear portion of the lamp body (and also possibly a reflector) 10C is formed in a stepped configuration so that a plurality of stepped planes 70 are formed and arranged at different levels. Step surfaces 71 connect the stepped planes 70

Formed on the rear surface of each stepped plane 70 is a shallow concave portion 72 that has a generally rectangular shape. A positioning opening 73 is opened at substantially a central portion of the concave portion 72 so as to extend in the longitudinal direction. Support pins 74 are formed on the rear surface of the stepped plane 70 to project rearward at locations on both sides of the positioning opening 73.

The luminescent element module 20 is formed with supporting holes 33 at positions sandwiching the light-emitting diode 40 on the coating 32 of the flexible parallel wiring body 30. Furthermore, stepped bent portions 36 and triangular folded portions 37 and the like are formed on the flexible parallel wiring body 30 such that the light-emitting diodes 40 are positioned to correspond to the concave portions 72 of the stepped planes 70 of the lamp body 10C (see FIG. 7(a)).

The front ends of the packages 41 of the light-emitting diodes 40 are fitted to the shallow concave portions 72 of the back surface of the lamp body 10C such that the transparent lens portions 42 are positioned in the positioning openings 73 to face forward. In addition, the support pins 74 projecting from the back surface of the lamp body 10C are inserted through the supporting holes 33 of the luminescent element module 20. The end portions of the support pins 74 inserted through the supporting holes 33 are formed into the bulged ends 74a by heat caulking or the like so that the separation of the luminescent element module 20 from the support pins 74 is prevented (see FIG. 7(b)). As a result, the luminescent element module 20 is provided on the back surface of the lamp body 10C, and the light-emitting diodes 40 are positioned in the lamp body 10C.

In addition to the method described above, positioning of the light-emitting diodes 40 can be achieved by the structure shown in FIG. 7(c), wherein the insertion holes 75 (only one of them is shown in FIG. 7(c)) which are slightly larger than the packages 41 of the light-emitting diodes 40 are formed in the lamp body 10C. The light-emitting diode 40 is brought to be positioned inside the insertion hole 75, and after which the support pins 74 are inserted through the supporting holes 33 of the flexible parallel wiring body 30. The bulged ends 74a are formed on the ends of the support pins 74 so that the separation of the luminescent element module 20 from separated from the lamp body 10C is prevented. It is also possible to divide the luminescent element module 20 using the triangular folded portion 37 for a three-dimensional arrangement.

In the above-described structures, the flexible parallel wiring bodies 30 and 30A of the luminescent element modules 20 and 20A are provided with two wiring conductors 31 and 31A. However, in the present invention, a more complicated circuit configuration is accomplished by a flexible parallel wiring body that includes three or more wiring conductors arranged in parallel. Examples of the luminescent element module that uses a flexible parallel wiring body having three or more wiring conductors will be described below.

Figure 8A:
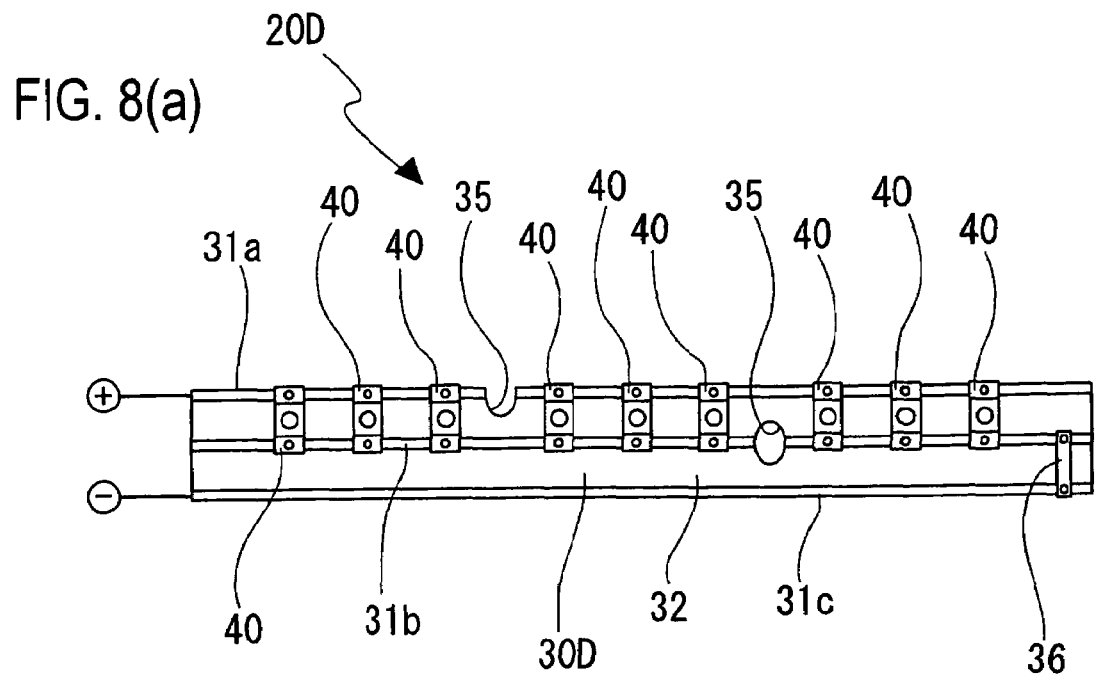
FIG. 8(a) shows another example of the luminescent element module according to the present invention.
Figure 8B:
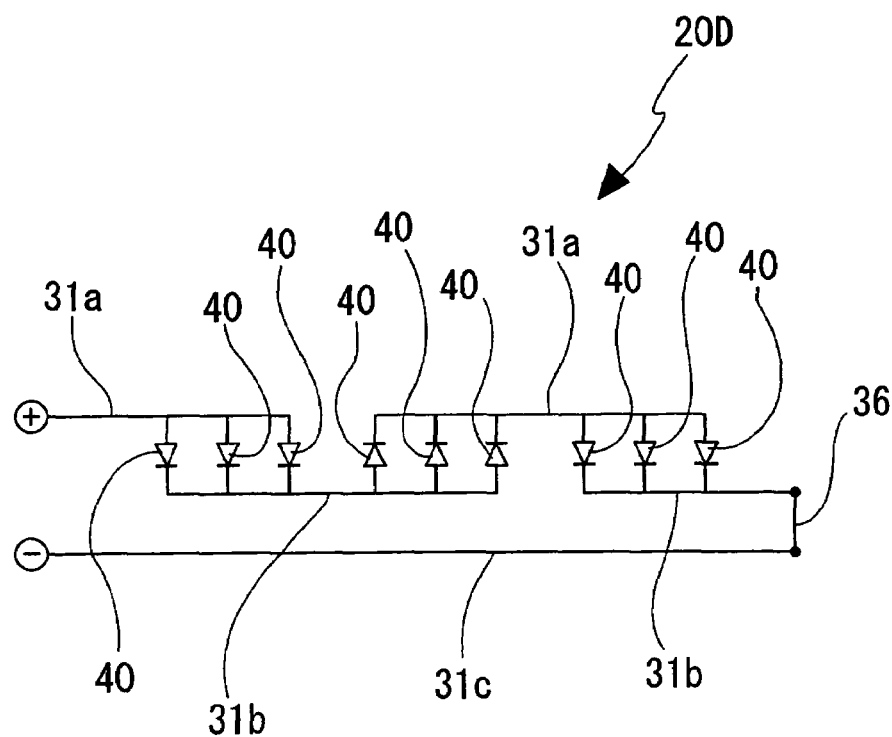
FIG. 8(b) is a circuit diagram thereof.

In the structure shown in FIG. 8(a), the light-emitting diodes 40 are provided between the first wiring conductor 31a and the second wiring conductor 31b. Notches 35 are formed on the first wiring conductor 31a and the second wiring conductor 31b, respectively. A circuitry that connects the parallel circuits of the light-emitting diode 40 in series is formed between the end portion of the first wiring conductor 31a and the end portion of the second wiring conductor 31b; and the second wiring conductor 31b and the third wiring conductor 31c are connected by a joint 36 at the other end portion of the series circuit. As a result, a circuitry that connects three parallel circuits of the light-emitting diode 40 in series as shown in FIG. 8(b) is formed between the end portion of the first wiring conductor 31a and the end portion of the third wiring conductor 31c.

Figure 9A:
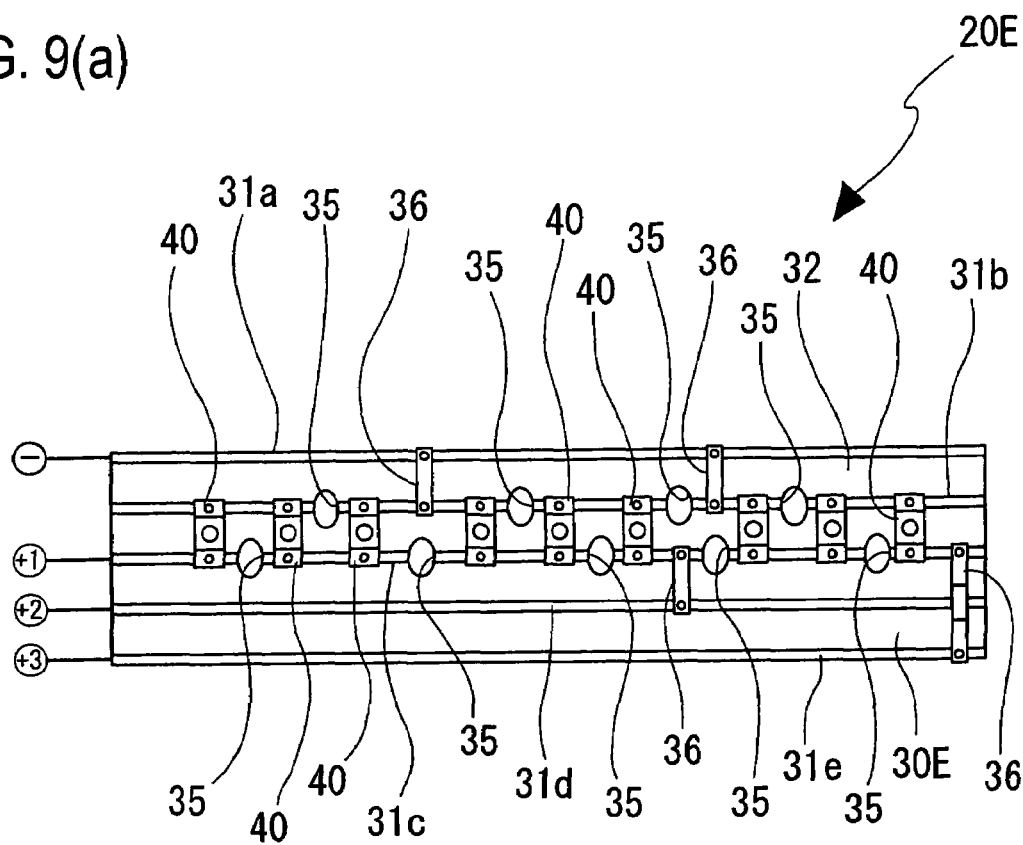
FIG. 9(a) shows still another example of the luminescent element module according to the present invention.
Figure 9B:
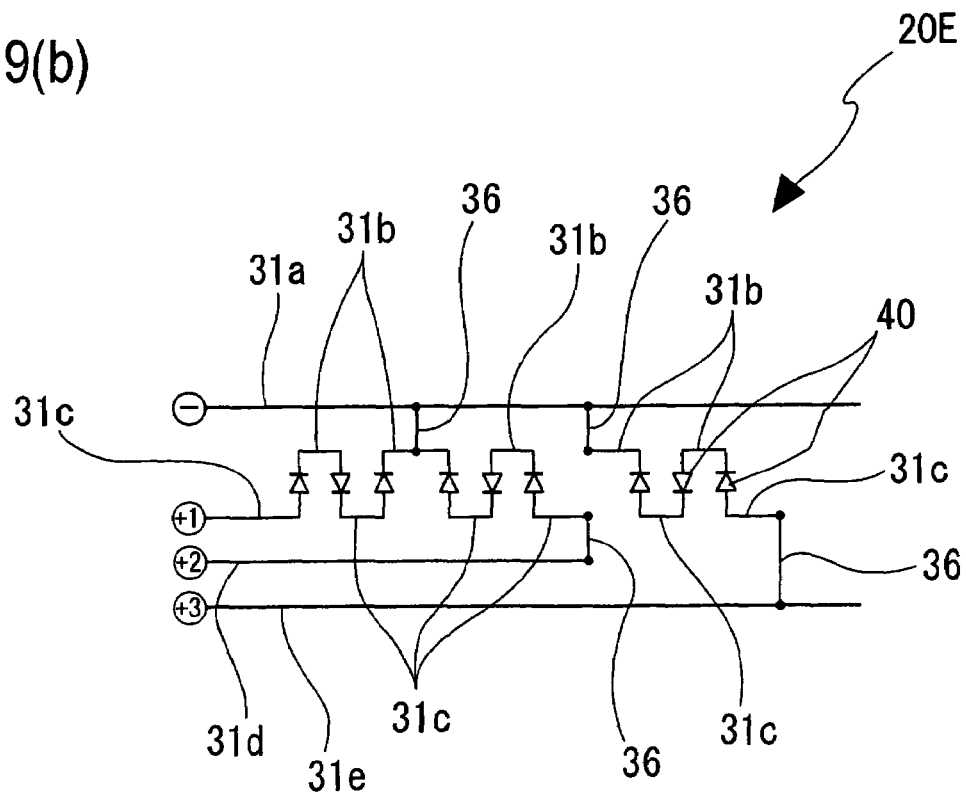
FIG. 9(b) is a circuit diagram thereof.

FIGS. 9(a) and 9(b) show the structure in which five wiring conductors arranged parallel are provided.

In this structure, for example, as shown in FIG. 9(a), the light-emitting diodes 40 are provided between the second wiring conductor 31b and third wiring conductor 31c. Notches 35 are formed on the second wiring conductor 31b and the third wiring conductor 31c, respectively. Joints 36 are provided so as to connect the first wiring conductor 31a and the second wiring conductor 31b, the third wiring conductor 31c and the fourth wiring conductor 31d, as well as the third wiring conductor 31c and the fifth wiring conductor 31e. In addition, the end portion of the third wiring conductor 31c is connected to a first power source +1, the end portion of the fourth wiring conductor 31d is connected to a second power source +2, and the end portion of the fifth wiring conductor 31e is connected to a third power source +3; and the end portion of the first wiring conductor 31a is grounded. As a result, as shown in FIG. 9(b), three series circuits of the light-emitting diodes 40 are formed which are connected to the first power source +1, the second power source +2, and the third power source +3, respectively.

In the above-described connection configuration as shown in FIGS. 9(a) and 9(b), different numbers of light-emitting diodes 40 are lit up in each of the cases where the power is supplied only from the first power source +1, the power is supplied from the first and second power source +1 and +2, and the power is supplied from all three power sources +1, +2, +3. As a result, three different stages of light-emitting brightness are obtained in the vehicular lamp. If this structure is used in a vehicular stop lamp, it can be designed as described as follows: the power is supplied, for instance, from the first power source +1 when the brake is applied to light up the stop lamp, notifying the other drivers that the braking has begun; when the brake is further applied to create a larger braking force, the power is supplied from the second power source +2 also, so that the stop lamp is lit even brighter to notify the other drivers that the vehicle will stop; and in the event of an emergency and the brake is applied abruptly, then the power is supplied from all three power sources +1, +2, +3 to light up the stop lamp to an extreme level of brightness, thus notifying the other drivers of the emergency stop.

As described above, in the present invention, a complicated circuit configuration can be made by way of increasing the number of wiring conductors arranged for light distribution.

With a use of the flexible parallel wiring bodies, a circuit module can be formed in addition to the luminescent element module.

Figure 10A:
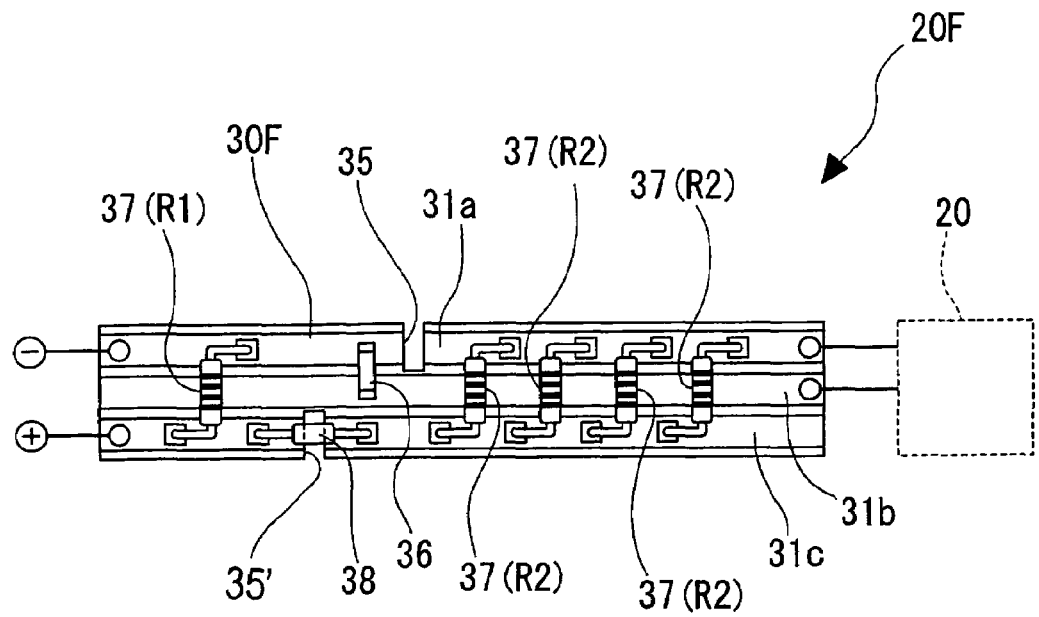
FIG. 10(a) shows an example of the circuit module of the present invention.
Figure 10B:
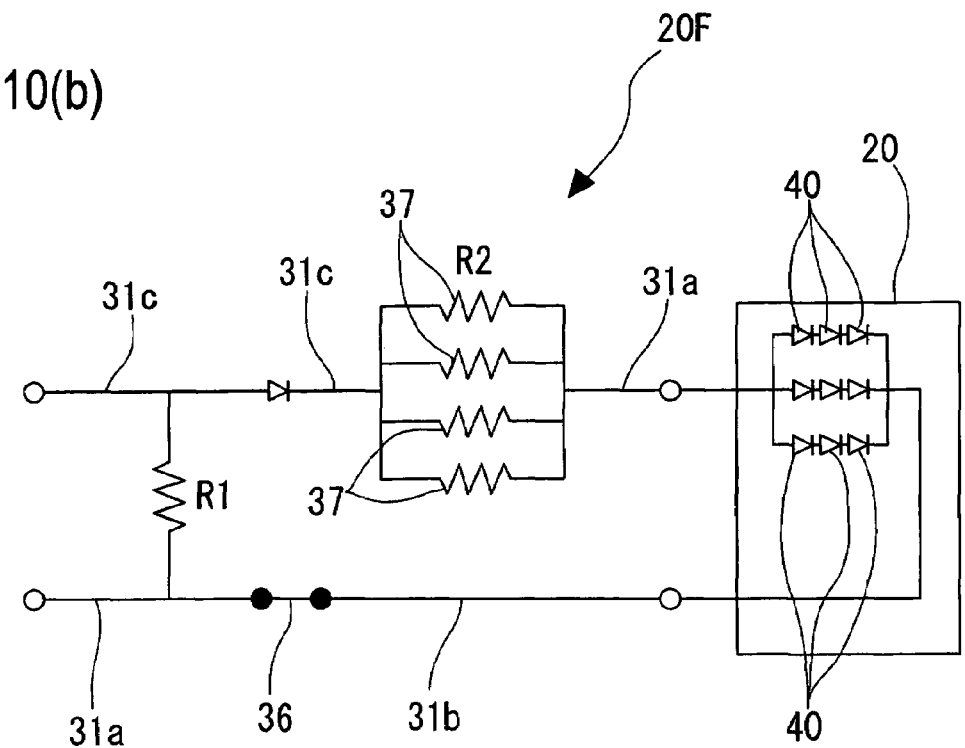
FIG. 10(b) is a circuit diagram thereof.

FIGS. 10(a) and 10(b) show an example of the lighting module for lighting the luminescent element module 20 or the like, which is configured as a circuit module 20F.

More specifically, as seen from FIG. 10(a), resistors 37 are connected between the first wiring conductor 31a and the third wiring conductor 31c, which is of a flat plate line type. A notch 35 is formed between the resistor 37(R1) at one end and other four resistors 37(R2), thus cutting the first wiring conductor 31a. The first wiring conductor 31a and the second wiring conductor 31b are connected by a joint 36 at a position adjacent to the notch 35. Furthermore, another notch 35' is formed so as to cut the third wiring conductor 31c between the location to which the resistor 37(R1) at the end is connected and the location to which the other four resistors 37(R2) are connected. A diode 38 is connected between the two locations separated by the notch 35'. The end portion of the first wiring conductor 31a is grounded, and the end of the third wiring conductor 31c is connected to a power source via a switch (such as a brake detecting switch). A power supply voltage end terminal of the luminescent element module 20 or the like is connected to the other end of the first wiring conductor 31a, and an earth terminal of the luminescent element module 20 or the like is connected to the other end of the second wiring conductor 31b. As a result, a circuit configuration shown in FIG. 10(b) is obtained.

As seen from the above, with a plurality of electronic components 36, 37 and 38 on the flexible parallel wiring body 30F, it is possible to form a circuit module that is arranged three-dimensionally. In addition, since a desired conductive path can be formed by notching a part(s) of the wiring conductor and/or connecting a plurality of wiring conductors together, a circuit configuration which is more complicated than that which uses a bus bar is obtainable, which is less expensive than a circuit that uses FPC. Furthermore, with a use of three or more wiring conductors, it is possible to form a more complicated circuit layout.

The lamp bodies 10, 10A and 10C in the above-described embodiments all have the reflective surfaces on their inner surfaces; however, reflectors can be provided separately insides the lamp bodies.

Moreover, the shape and structure of each portion in the above embodiments are all mere examples for carrying out the present invention, and they should not be interpreted to limit the technical scope of the present invention in any manner.

As seen from the above, according to the present invention, a vehicular lamp that uses a light-emitting diode as the light source and manufactured at low cost while not being limited in shape is obtainable.

The invention claimed is:

1. A vehicular lamp with a luminescent element module that has a plurality of light-emitting diodes and is provided on a back surface of a lamp body of said vehicular lamp, wherein:

said luminescent element module comprises a flexible parallel wiring body, which is made of a plurality of flexible wiring conductors that are disposed parallel to each other and sheathed by soft plastic, and a plurality of light-emitting diodes, which are mounted on said flexible parallel wiring body, said luminescent element module being provided with a conductive path formed by notching a part of said wiring conductors of said flexible parallel wiring body; and said luminescent element module is provided on said lamp body so that a plurality of transparent lens portions of said light-emitting diodes are positioned inside a plurality of positioning openings in a rear surface of said lamp body to face in a direction of radiation of said vehicular lamp.

2. The vehicular lamp according to claim 1, wherein said luminescent element module is provided on said lamp body with said light-emitting diode of said luminescent element module being attached to said lamp body.

3. The vehicular lamp according to claim 2, wherein said lamp body is provided with a positioning means formed on a back surface thereof, and said light emitting diode of said luminescence element module is engaged with said positioning means, thus being positioned in said lamp body.

4. The vehicular lamp according to claim 1, wherein said luminescent element module is installed in a lamp cover, and said lamp cover is provided on said lamp body.

5. The vehicular lamp according to claim 3, wherein said lamp body is provided with a positioning means formed on a back surface thereof, and said lamp cover in which said luminescence element module is installed is engaged with said positioning means, thus being positioned on said lamp body.

6. The vehicular lamp according to claim 1, wherein said flexible parallel wiring body is equipped with three or more wiring conductors.

7. A vehicular lamp with a circuit module provided on a back surface of a lamp body of said vehicular lamp, wherein said circuit module comprises:

a flexible parallel wiring body made of a plurality of flexible wiring conductors that are disposed parallel to each other and sheathed by soft plastic, and a plurality of electronic components mounted on said flexible parallel wiring body; and wherein said circuit module is provided with a conductive path formed by notching a part of said wiring conductors of said flexible parallel wiring body.

8. The vehicular lamp according to claim 7, wherein said flexible parallel wiring body is provided with three or more wiring conductors.

* * * * *